United States Patent
Matsui et al.

(10) Patent No.: US 7,741,924 B2
(45) Date of Patent: Jun. 22, 2010

(54) TEMPERATURE-COMPENSATED CRYSTAL OSCILLATOR AND TEMPERATURE COMPENSATION METHOD FOR OSCILLATOR

(75) Inventors: Hiroshi Matsui, Kanagawa (JP); Yuichi Takagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 14 days.

(21) Appl. No.: 12/127,201

(22) Filed: May 27, 2008

(65) Prior Publication Data

US 2008/0297268 A1 Dec. 4, 2008

(30) Foreign Application Priority Data

May 29, 2007 (JP) .......................... P2007-142306

(51) Int. Cl.
  *H03L 1/02* (2006.01)
(52) U.S. Cl. ...................... 331/176; 331/66; 331/177 V
(58) Field of Classification Search ................... 331/66, 331/176, 177 V
  See application file for complete search history.

(56) References Cited

U.S. PATENT DOCUMENTS 5,774,800 A * 6/1998 Mori ........................... 455/255

FOREIGN PATENT DOCUMENTS

| JP | 7-162295 | 6/1995 |
|----|----------|--------|
| JP | 2001-28514 | 1/2001 |
| JP | 2002 198736 | 7/2002 |

* cited by examiner

*Primary Examiner*—Robert Pascal
*Assistant Examiner*—James E Goodley
(74) *Attorney, Agent, or Firm*—Frommer Lawrence & Haug LLP; William S. Frommer; Thomas F. Presson

(57) ABSTRACT

A temperature-compensated crystal oscillator including an oscillation circuit which includes an oscillator, a temperature detector, a voltage variable capacitance element coupled to an oscillation loop of the oscillation circuit, and a temperature compensation circuit. The temperature compensation circuit is configured to apply a compensation voltage to the voltage variable capacitance element to compensate a temperature change in response to temperature data detected by the temperature detector. The temperature compensation circuit has a plurality of correction point data. The respective correction point data is set in advance for each divided temperature zone, selects a first correction point data in a lower temperature zone and a second correction point data in a higher temperature zone, as compared with the detected temperature data, performs an interpolation between the first and second correction point data by a weighted averaged first-order interpolation, and generates the compensation voltage.

8 Claims, 2 Drawing Sheets

$Y = Ax^3 + Bx^2 + Cx + D$

TEMPERATURE-COMPENSATED CRYSTAL OSCILLATOR AND TEMPERATURE COMPENSATION METHOD FOR OSCILLATOR

CROSS-REFERENCE TO RELATED APPLICATIONS

The present application claims benefit of priority of Japanese patent Application No. 2007-142306 filed in the Japanese Patent Office on May 29, 2007, the entire disclosure of which is incorporated herein by reference.

BACKGROUND OF THE INVENTION

1. Field of the Invention

The present invention relates to a temperature-compensated crystal oscillator using a resonator such as a crystal, and a temperature compensation method for an oscillator.

2. Description of Related Art

A crystal oscillator is used as an oscillation element for obtaining a reference frequency in communication with a mobile phone, a GPS device or the like.

The crystal oscillator has a very high accuracy of oscillation frequency but it still has a slight temperature characteristic, and a usual AT-cut crystal oscillator shows a cubic curve.

An oscillator in which temperature changes are compensated by controlling the cubic curve to be cancelled is called a temperature-compensated crystal oscillator (TCXO).

There are two types of temperature compensation methods, i.e., an analog temperature compensation method and an LSI temperature compensation method, and the LSI temperature compensation method is the mainstream method because it has an advantage of reducing the size.

An LSI includes a temperature compensation circuit and an oscillation circuit. As the temperature compensation circuit, there have been proposed various methods, for example, the temperature compensation circuit is disclosed in Japanese Unexamined Patent Application Publication No. 2002-198736.

The most representative temperature compensation circuit employs a method in which a voltage represented by a cubic curve is generated in an LSI to control an oscillation frequency of a voltage controlled crystal oscillator (VCXO).

In order to generate the cubic curve, the LSI has a thermometer (a first voltage) and combines a DC voltage (zero-order voltage), a secondary voltage and a tertiary voltage generated by a square-root circuit and a cube-root circuit. By using coefficients at the time of combining the voltages as parameters, the cubic curves can be freely drawn as shown in FIG. 1.

This is expressed as a following equation (1).

$$V=A(T-T_0)^3+B(T-T_0)^2+C(T-T_0)+D \quad (1)$$

Until now, the temperature characteristic of the crystal oscillator can be relatively accurately compensated by adjusting these four parameters of A, B, C and D in the Equation 1.

SUMMARY OF THE INVENTION

However, with the reduction of size of the temperature-compensated crystal oscillator (TCXO), the size of the crystal oscillator is also reduced, and thus the temperature characteristic is largely varied. For this reason, it becomes difficult to correct the temperature characteristic by the cubic curve, and it become difficult to maintain the accuracy of the crystal oscillator.

Further, it is also pointed out that since the secondary voltage and the tertiary voltage generated by the square-root circuit and the cube-root circuit contain much noise content, the oscillator has a poor phase noise characteristic.

Accordingly, it is desirable to provide a temperature compensation crystal oscillator which has a sufficient compensate accuracy and a satisfactory noise characteristic, and a temperature compensation method for an oscillator.

In accordance with a first aspect of the present invention, there is provided a temperature-compensated crystal oscillator includes an oscillation circuit including an oscillator, a temperature detector, a voltage variable capacitance element coupled to an oscillation loop of the oscillation circuit, and a temperature compensation circuit. The temperature compensation circuit is configured to apply a compensation voltage to the voltage variable capacitance element to compensate a temperature change in response to temperature data detected by the temperature detector. The temperature compensation circuit has a plurality of correction point data in which the respective correction point data is set in advance for each divided temperature zone. The temperature compensation circuit selects a first correction point data in a lower temperature zone and a second correction point data in a higher temperature zone, compared with the detected temperature data, performs an interpolation between the first and second correction point data by a weighted averaged first-order interpolation, and generates the compensation voltage.

The temperature compensation circuit may obtain each first-order coefficient by a subtraction of digital data related to the correction point data.

The temperature compensation circuit may obtain:

a first-order coefficient of the first correction point data in the lower temperature zone by performing a subtraction between the second correction point data in the higher temperature zone and a third correction point data in a further lower temperature zone than the first correction point data in the lower temperature zone; and a first-order coefficient of the second correction point data in the higher temperature zone by performing a subtraction between the first correction point data in the lower temperature zone and a fourth correction point data in a further higher temperature zone than the second correction point data in the higher temperature zone.

The temperature compensation circuit may generate a first correction value, a second correction value. The first correction value is generated by adding a product obtained by multiplying a slope data and a first residue between the temperature detected by the temperature detector and a temperature corresponding to the first correction point data in the lower temperature zone, to the first correction point data. The slope data is obtained from a subtraction between the second correction point data and the third correction point data. The second correction value is generated by adding a product obtained by multiplying a slope data and a second residue between the temperature detected by the temperature detector and a temperature corresponding to the second correction point data in the higher temperature zone. The slope data is obtained from a subtraction between the first correction point data and the fourth correction point data. The compensation voltage is generated by calculating a weighted average of the first correction value and the second correction value.

The temperature compensation circuit may perform a weighted average calculation in accordance with the first residue and the second residue.

The temperature compensation circuit may have a dead area at an end of the weighted average into which the temperature zone is shifted, and processes one of a plurality of linear functions as an insensitive linear function.

The temperature compensation circuit may change only the insensitive linear function when the temperature zone is shifted.

In accordance with a second aspect of the present invention, there is provided a temperature-compensated crystal oscillator includes an oscillation circuit having an oscillator, a temperature detector, a voltage variable capacitance element coupled to an oscillation loop of the oscillation circuit, and a temperature compensation circuit. The temperature compensation circuit is configured to apply a compensation voltage to the voltage variable capacitance to compensate a temperature change in response to temperature data detected by the temperature detector. The temperature compensation circuit includes a memory, a first converter, a second converter, a subtractor, a first multiplier, a second multiplier, a first adder, a second adder, a weighted average circuit. The memory stores a plurality of correction point data each of which is set in advance for each divided temperature zone, and outputs, as digital data, a first point data in a lower temperature zone compared with temperature data detected by the temperature detector, a second point data in a higher temperature zone compared with the temperature data, a third point data in a further lower temperature zone than the first correction point data in the lower temperature zone, a fourth correction point data in a further higher temperature zone than the second correction point data in the higher temperature zone. The first converter converts the first correction point data into analog data. The second converter converts the second correction point data into analog data. The subtractor obtains a first slope by performing a subtraction between the second correction point data in the higher temperature zone and the third correction point data in the lower temperature zone, and a second slope by performing a subtraction between the first correction point data in the lower temperature zone and the fourth correction point data in the higher temperature zone. The first multiplier multiplies the first slope data by a first residue between the temperature detected by the temperature detector and a temperature corresponding to the first correction point data in the lower temperature zone. The second multiplier multiplies the second slope data by a second residue between the temperature detected by the temperature detector and a temperature corresponding to the second correction point data in the higher temperature zone. The first adder generates a first correction value by adding output data from the first converter and output data from the first multiplier. The second adder generates a second correction value by adding output data from the second converter and output data from the second multiplier. The weighted average circuit generates the compensation voltage by calculating a weighted average of the first correction value and the second correction value in accordance with the first residue and the second residue.

In accordance with a third aspect of the present invention, there is provided a temperature compensation method for an oscillator including a voltage variable capacitance element coupled to an oscillation loop of an oscillation circuit and for compensating temperature variations of an applied voltage to the voltage variable capacitance element, including the steps of: setting a plurality of correction point data, the respective correction point data being set in advance for each divided temperature zone; selecting a first correction point data in a lower temperature zone and a second correction point data in a higher temperature zone, as compared with detected temperature data; performing an interpolation between the first and second correction point data by a weighted average first-order interpolation; and generating the compensation voltage.

According to embodiments of the present invention, it is possible to provide a temperature compensation crystal oscillator which has a sufficient compensate accuracy and a satisfactory noise characteristic, and a temperature compensation method for an oscillator.

The above summary of the present invention is not intended to describe each illustrated embodiment or every implementation of the present invention. The figures and the detailed description which follow more particularly exemplify these embodiments.

DETAILED DESCRIPTION OF EMBODIMENTS

Hereinafter, an embodiment of the present invention is described in relation to the accompanying drawings.

Figure 1:
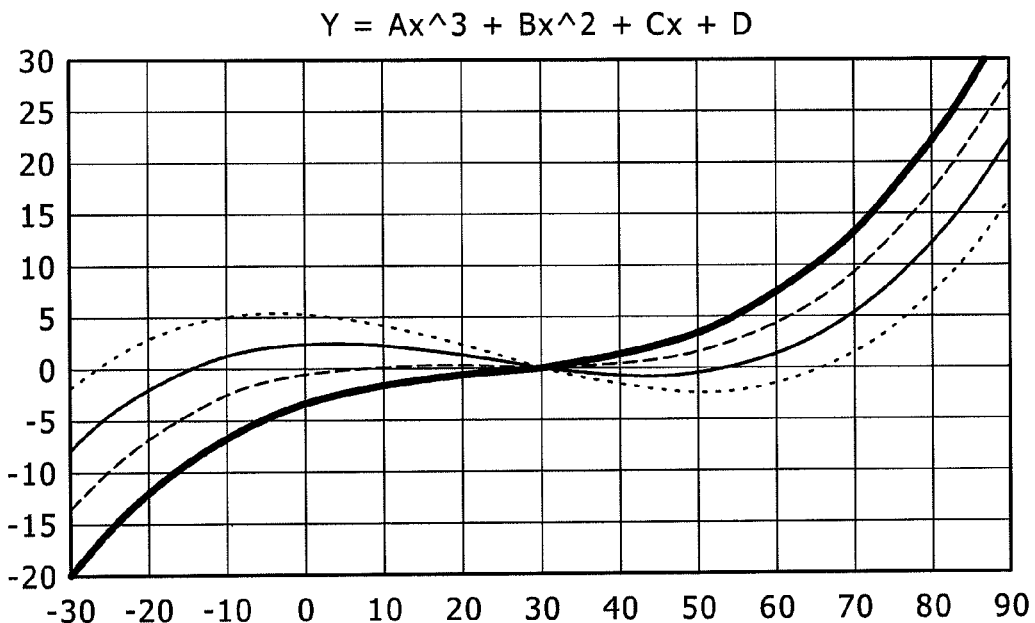
FIG. 1 shows an example of cubic curves of voltages generated in an LSI of a representative temperature compensation circuit.
Figure 2:
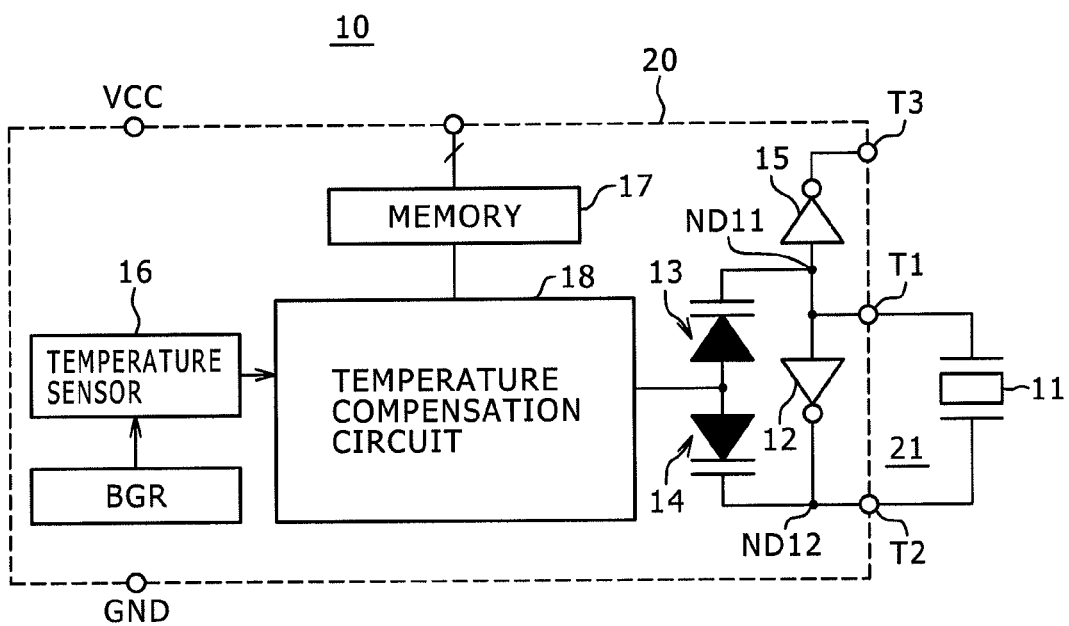
FIG. 2 is a block diagram showing a configuration example of a temperature-compensated crystal oscillator according to an embodiment of the present invention.

FIG. 2 is a block diagram showing a configuration example of a temperature-compensated crystal oscillator according to an embodiment of the present invention.

The temperature-compensated crystal oscillator 10 has, as shown in FIG. 2, a crystal oscillator 11, an inverter 12 served as an oscillating element, voltage variable capacitance elements 13 and 14, an inverter 15 served as an output buffer, a temperature sensor 16, a memory 17, and a temperature compensation circuit 18.

In these constituent elements, except the crystal oscillator 11, the inverter 12 served as an oscillating element, the voltage variable capacitance elements 13, 14, the inverter 15 served as an output buffer, the temperature sensor 16, the memory 17, and the temperature compensation circuit 18 are integrated on a single chip (LSI) 20.

One end of the crystal oscillator 11 is connected to an input terminal of the inverter 12 and to an input terminal of the inverter 15 via a terminal T1, and the other end is connected to an output terminal of the inverter 12 via a terminal T2. An output terminal of the inverter 15 is connected to a terminal T3.

A junction of the input terminals of the inverters 12 and 15 and the terminal T1 forms a node ND11, and a junction of the output terminal of the inverter 12 and the terminal T2 forms a node ND12.

One end of the voltage variable capacitance element 13 is connected to the node ND11 and one end of the voltage variable capacitance element 14 is connected to the node ND12.

Other ends of the voltage variable capacitance element 13 and the voltage variable capacitance element 14 are connected to an output terminal of the temperature compensation circuit 18, from which a compensation voltage VT is output.

In the temperature-compensated crystal oscillator 10, an oscillation circuit (oscillation loop) 21 is formed by the crystal oscillator 11 and the inverter 12.

The temperature compensation circuit 18 generates the compensation voltage VT depended on ambient temperature detected by the temperature sensor 16, and applies the compensation voltage VT to the voltage variable capacitance elements 13, 14 served as voltage control oscillators. The specific configuration and functions of the temperature compensation circuit 18 are described later.

A capacitance between the voltage variable capacitance elements 13, 14 changes according to the compensation voltage VT. As a result, a series equivalent capacitance (load capacitance) at the circuit zone viewed from the crystal oscillator 11 is changed, and the oscillation frequency is changed in response to the temperature, and the temperature is thus compensated.

The temperature-compensated oscillation signal is outputted from the terminal T3 via the inverter 15.

The specific configuration and functions of the temperature compensation circuit 18 are described below.

Figure 3:
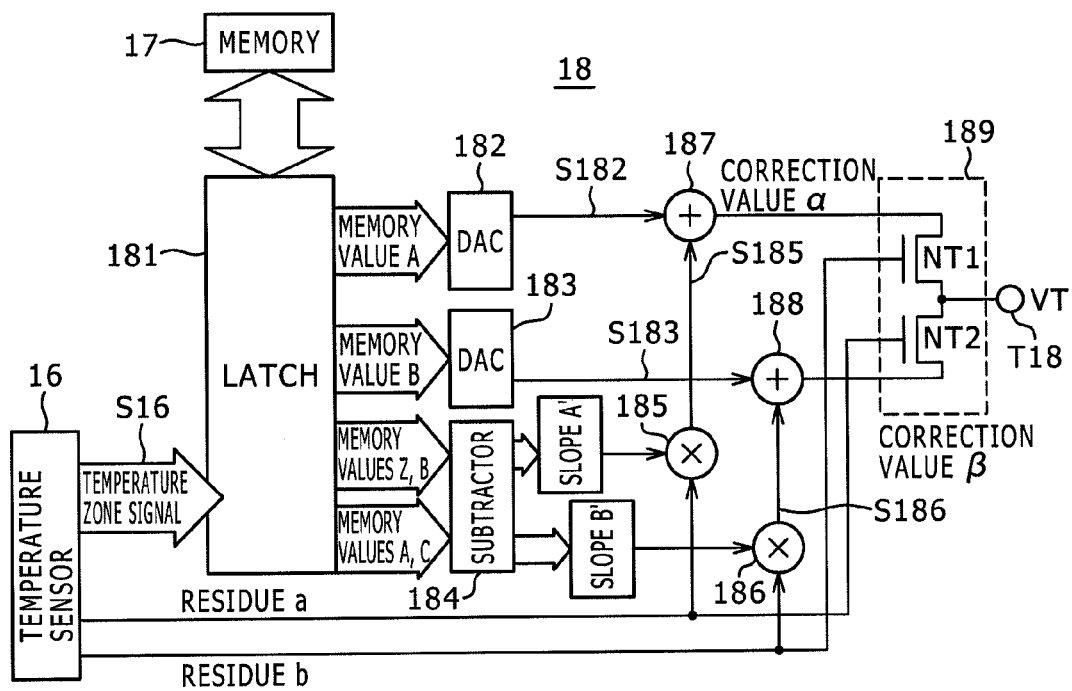
FIG. 3 shows a specific configuration example of a temperature compensation circuit of the temperature-compensated crystal oscillator in FIG. 2.

FIG. 3 shows a specific configuration example of the temperature compensation circuit of the temperature-compensated crystal oscillator in FIG. 2.

Figure 4:
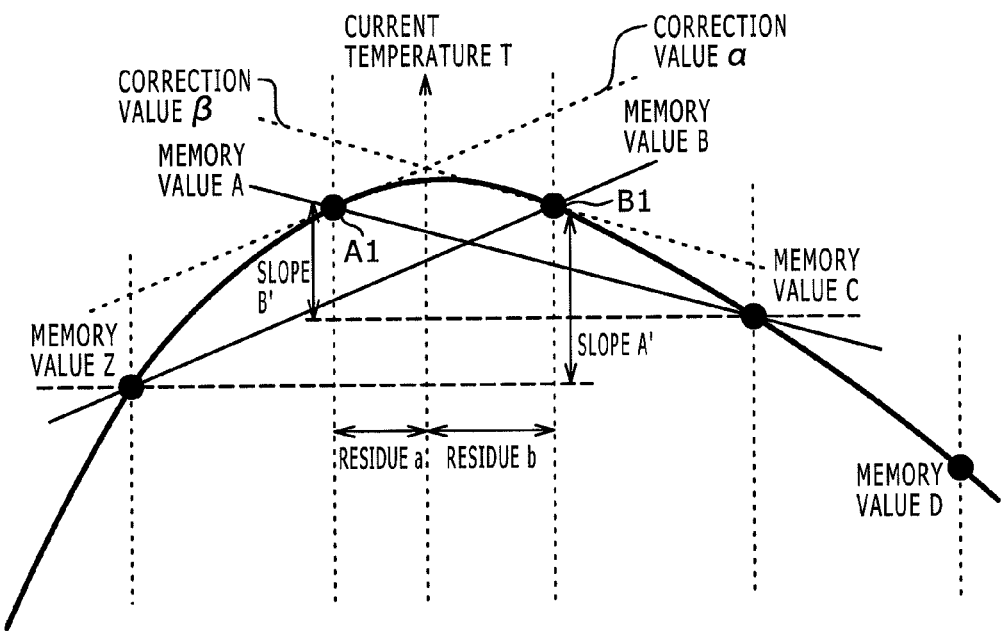
FIG. 4 is a diagram for illustrating an operation principle of the temperature compensation circuit in FIG. 3.

FIG. 4 is a diagram for illustrating an operation principle of the temperature compensation circuit in FIG. 3.

The temperature compensation circuit 18 in FIG. 3 has a latch (memory) 181, a first digital/analog converter (hereinafter, referred to as a "DAC") 182, a second DAC 183, a subtractor 184, a first multiplier 185, a second multiplier 186, a first adder 187, a second adder 188, and a weighted average circuit 189.

In the present embodiment, in order to accommodate temperature variations in the crystal oscillator 11, the temperature zones, divided into small sections (for example, the temperatures ranging from −20 C.° to 70 C.° are divided by every 5 C.°), are set and many correction points are provided therein. An interpolation between the correction points is performed by calculating a weighted average of a linear function (correction value) α and a linear function (correction value) β.

This method does not require the square-root circuit and the cube-root circuit. In addition, this method is possible to correct any of the curves, for example, in a case where a curve representing the temperature characteristic of the crystal shows a significant deviation from a cubic function.

Data of the correction points are stored in the memories 17, 18 of the LSI as about 8-bit digital data. Since there are many correction points, a relatively large memory capacity (several hundreds bits) may be necessary. The data of the correction points itself is obtained from temperature measurements of the crystal oscillator by offline operations using a predetermined method, and is stored in the LSI 20.

More specifically, the memory 181 (and the memory 17) of the LSI 20 stores the digital data of the correction points corresponding to a plurality of predetermined temperatures. In the present embodiment, data of four correction points are used, which are two points before and two points after the current temperature of the LSI 20 measured by the temperature sensor 16, and these four correction points are called as Z, A, B, and C from the lower temperature zone, as shown in FIGS. 3 and 4.

For example, a temperature zone signal S16, which is a temperature detected by the temperature sensor 16 and converted into a digital value, is supplied as an address to the memory 181, and based on the address data, memory values Z, A, B, and C are read out, which are the data of the four correction points.

The memory value A is inputted to the first DAC 182, the memory value B is inputted to the second DAC 183, the memory values Z and B are supplied to the subtractor 184, and the memory values Z and C are supplied also to the subtractor 184.

The memory 181 of the present embodiment outputs, as digital data, a first correction point data A in a lower temperature zone as compared with the temperature data detected by the temperature sensor 16, a second correction point data B in a higher temperature zone as compared with the temperature data detected by the temperature sensor 16, a third correction point data Z in a further lower temperature zone than the first correction point data A in the lower temperature zone, and a fourth correction point data C in a further higher temperature zone than the second correction point data B in the higher temperature zone.

The first DAC 182 converts the memory value A into an analog value, and outputs the analog value as a signal S182 to the first adder 187.

The second DAC 183 converts the memory value B into an analog value, and outputs the analog value as a signal S183 to the second adder 188.

The subtractor 184 performs a subtraction between the memory values Z and B to calculate a first slope A', and outputs the first slope A' to the first multiplier 185. The subtractor 184 performs a subtraction between the memory values A and C to calculate a second slope B', and outputs the second slope B' to the second multiplier 186.

The second multiplier 185 multiplies the first slope A' outputted from the subtractor 184 by a residue $\underline{a}$ to the current temperature T, and outputs the product as a signal S185 to the first adder 187.

The second multiplier 186 multiplies the second slope B' outputted from the subtractor 184 by a residue $\underline{b}$ to the current temperature T, and outputs the product as a signal S186 to the second adder 188.

Here, the first residue $\underline{a}$ is a difference between the current temperature T and a temperature corresponding to the correction point positioned closest to the current temperature T in the lower temperature zone (corresponding to the memory value A in the example in FIG. 4). The second residue $\underline{b}$ is a difference between the current temperature T and a temperature corresponding to the correction point positioned closest to the current temperature T in the higher temperature zone (corresponding to the memory value B in the example in FIG. 4).

The first adder 187 adds the output signal S182 from the first DAC 182 and the output signal S185 from the first multiplier 185, and outputs the sum as a correction value α to the weighted average circuit 189.

The second adder 188 adds the output signal S183 from the DAC 183 and the output signal S186 from the second multiplier 186, and outputs the sum as a correction value β to the weighted average circuit 189.

The weighted average circuit 189 calculates a weighted average of the correction value α and the correction value β, and applies the weighted average, as a compensation (correction) voltage VT at the current temperature, to the voltage variable capacitance elements 13, 14 from the terminal T18.

The weighted average circuit 189 has, for example, n-channel MOS (NMOS) transistors NT1, NT2 as shown in FIG. 3.

The NMOS transistors NT1, NT2 are serially connected between a supply line Lα of the correction value α and a supply line Lβ of the correction value β. The data of the second residue b is supplied to a gate of the NMOS transistor NT1, the data of the first residue a is supplied to a gate of the NMOS transistor NT2, and a connection node of the two transistors NT1, NT2 outputs from the terminal T18 the compensation voltage VT, which is the weighted average of the correction value α and the correction value β.

The values of the first residue a and the second residue b have what is called a complementary relationship, and on-resistances of the NMOS transistors NT1, NT2 are changed in accordance with the values of the first residue a and the second residue b. This adjusts the proportion of the correction value α and the correction value β involving the weighted average, and thus the compensation voltage VT accurately following the temperature change is obtained.

The above description illustrates the configuration of the temperature compensation circuit 18.

Next, the operation of the temperature compensation circuit 18 having the above-mentioned configuration is described in relation to FIGS. 3 and 4.

In the memories 181, 17 of the LSI 20, the digital data of each correction point is stored. By using the data of four correction points, which are two points before and two points after the current temperature detected by the temperature sensor 16 of the LSI 20, the four correction data are read out as the memory values Z, A, B, and C from the lower temperature zone.

The memory value A of a correction point A1 and the memory value B of a correction point B1 are D/A converted by the DAC 182, 183, and thus each analog voltage (or current) value S182, S183 is obtained.

On the other hand, the subtractor 184 subtracts the memory value Z from the memory value B (digital calculation), and obtains the slope A'.

Similarly, the subtractor 184 subtracts the memory value A from the memory value C, and obtains the slope B'. By using the data of the slope B' and the slope A' as coefficients, linear functions are created, and when the voltage (or current) values of the correction point A1 and the correction point B1 are given as zero-order coefficients to each function, the correction value α and the correction value β in FIG. 4 is obtained through calculations performed by the multipliers 185, 186 and the adders 187, 188.

The compensation (correction) voltage VT at the current temperature T detected by the temperature sensor 16 is obtained by calculating the weighted average of the correction value α and correction value β in the weighted average circuit 189.

The first residue a and the second residue b are used for the weighted average calculation. More specifically, when the current temperature T is close to the temperature of the memory value A (the residue a is small and the residue b is large), the compensate (correction) voltage VT at the current temperature T selects the correction value α and approaches a voltage generated by D/A converting the memory value A.

As the current temperature T approaches the temperature of the memory value B, the first residue a becomes larger and the second residue b becomes smaller, and the correction value is gradually changed from the correction value α to the correction value β.

When the current temperature T approaches the temperature of the memory value B, the second residue b becomes smaller, and the compensate (correction) voltage VT at the current temperature T selects the correction value β and becomes a voltage substantially equal to a voltage generated by D/A converting the memory value B.

As above described, an interpolation between the memory value A and the memory value B is performed by the weighted average linear functions.

When the current temperature T to be detected by the temperature sensor 16 is shifted into the temperature zone between the memory value B and the memory value C, the correction value α should be newly calculated to use.

The memory value Z used so far in the subtraction is no longer necessary and the memory value D is newly used. For that reason, at the moment of changing the temperature zone, the correction value α is greatly changed.

In the present embodiment, in order to avoid the influence due to the change of temperature zone, a dead area is provided in the weighted average, in the vicinity of a region into which the temperature zone is shifted.

The correction value α is set as an insensitive value to avoid the influence of the correction value α in the vicinity of the memory value B, and the correction value β is set only to be followed.

By the arrangement thus configured, it is possible to obtain a smooth curve of the correction value even though the temperature zone is shifted.

When the temperature zone is shifted, it is also possible to interpolate by switching the two linear functions (the correction value α and the correction value β) of the weighted average, however, if the both functions are changed, the weighted average output may be influenced.

Accordingly, the present embodiment employs the circuit structure in which, even though the temperature zone is shifted, one linear function (the correction value β in the vicinity of the memory value B) is used as is, and only the correction value α served as the dead area is changed.

In the next shift of the temperature zone, the other linear function is only changed and two functions are alternately switched, and it is thereby possible to obtain the smooth curve of the correction value even in the shift of temperature zone.

As described above, according to an embodiment of the present invention, the temperature-compensated crystal oscillator includes the oscillation circuit 21 having the crystal oscillator 11, the temperature sensor 16, the voltage variable capacitance elements 13, 14 coupled to the oscillation loop of the oscillation circuit 21, and the temperature compensation circuit 18 for applying the compensation voltage VT to compensate a temperature change in response to temperature data detected by the temperature sensor 16, to the voltage variable capacitance elements 13, 14. The temperature compensation circuit 18 includes the memory 181 storing a plurality correction point data. The respective correction point data is set in advance for each divided temperature zone. The temperature compensation circuit 18s and outputs, as digital data, the first correction point data A in the lower temperature zone as compared with the detected temperature data, the second correction point data B in the higher temperature zone as compared with the detected temperature data, the third correction point data z in the further lower temperature zone than the first correction point data A in the lower temperature zone, and the fourth correction point data C in the further higher temperature zone than the second correction point data B in the higher temperature zone. The temperature compensation circuit includes: the first converter 182 for converting the first correction point data A into analog data, the second converter 183 for converting the second correction point data B into analog data, the subtractor 184 for obtaining the first slope A' by performing the subtraction between the second correction point data B in the higher temperature zone and the third correction point data Z in the lower temperature zone, and the second slope B' by performing the subtraction between the first correction point data A in the lower temperature zone and the fourth correction point data C in the higher temperature zone. The temperature compensation circuit also includes the first multiplier 185 for multiplying the first slope A' data by the first residue a between the detected temperature and the temperature corresponding to the first correction point data A in the lower temperature zone, the second multiplier 186 for multiplying the second slope B' data by the second residue b between the detected temperature and the temperature corresponding to the second correction point data B in the higher temperature zone, the first adder 187 for generating the first correction value α by adding the output data from the first converter 182 and the output data from the first multiplier 185, the second adder 188 for generating the second correction value β by adding the output data from the second converter 183 and the output data from the second multiplier 186, and the weighted average circuit 189 for generating the compensation voltage VT by calculating the weighted average of the first correction value α and the second correction value β in accordance with the first residue a and the second residue b. With the above-mentioned configuration, the following advantages can be expected.

In the TCXO, when the square-root circuit or the cube-root circuit is used in the temperature compensation circuit, noises may be increased. Since the method in an embodiment of the present invention uses only the linear function and does not require a high accuracy analog calculation circuit, an oscillator with low noise can be achieved.

Further, if the number of correction point is increased, data to be stored is also increased, however, according to the method in an embodiment of the present invention, any temperature compensation curves can be drawn, and hence the high accuracy temperature compensation can be achieved.

The temperature-compensated crystal oscillator 10 according to an embodiment of the present invention, it is possible to realize the frequency variation less than or equal to ±1 ppm.

Accordingly, the temperature-compensated crystal oscillator according to an embodiment of the present invention is sufficiently applicable as an oscillator used in a mobile device, such as a mobile telephone or a global positioning system (GPS).

It should be understood by those skilled in the art that various modifications, combinations, sub-combinations and alternations may occur depending on design requirements and other factors insofar as they are within the scope of the appended claims or equivalents thereof.

What is claimed is:

1. A temperature-compensated crystal oscillator comprising:
    an oscillation circuit including an oscillator;
    a temperature detector;
    a voltage variable capacitance element coupled to an oscillation loop of the oscillation circuit; and
    a temperature compensation circuit configured to apply a compensation voltage to the voltage variable capacitance element to compensate a temperature change in response to temperature data detected by the temperature detector,
        wherein the temperature compensation circuit has a plurality of correction point data, the respective correction point data being set in advance for each divided temperature zone, and
        wherein the temperature compensation circuit obtains:
            a first-order coefficient of a first correction point data in a lower temperature zone by performing a subtraction between a second correction point data in a higher temperature zone and a third correction point data in a further lower temperature zone than the first correction point data in the lower temperature zone, and
            a first-order coefficient of the second correction point data in the higher temperature zone by performing a subtraction between the first correction point data in the lower temperature zone and a fourth correction point data in a further higher temperature zone than the second correction point data in the higher temperature zone;
        selects a first correction point data in a lower temperature zone and a second correction point data in a higher temperature zone, as compared with the detected temperature data,
        performs an interpolation between the first and second correction point data by a weighted averaged first-order interpolation, and
        generates the compensation voltage.

2. The temperature-compensated crystal oscillator according to claim 1, wherein the temperature compensation circuit obtains each first-order coefficient by a subtraction of digital data related to the correction point data.

3. The temperature-compensated crystal oscillator according to claim 1, wherein the temperature compensation circuit generates:
    a first correction value by adding a product obtained by multiplying a slope data and a first residue between the temperature detected by the temperature detector and a temperature corresponding to the first correction point data in the lower temperature zone, to the first correction point data, the slope data being obtained from a subtraction between the second correction point data and the third correction point data;
    a second correction value by adding a product obtained by multiplying a slope data and a second residue between the temperature detected by the temperature detector and a temperature corresponding to the second correction point data in the higher temperature zone, to the second correction point data, the slope data being obtained from a subtraction between the first correction point data and the fourth correction point data; and
    the compensation voltage by calculating a weighted average of the first correction value and the second correction value.

4. The temperature-compensated crystal oscillator according to claim 3, wherein the temperature compensation circuit performs a weighted average calculation in accordance with the first residue and the second residue.

5. The temperature-compensated crystal oscillator according to claim 1, wherein the temperature compensation circuit has a dead area at an end of the weighted average into which the temperature zone is shifted, and processes one of a plurality of linear functions as an insensitive linear function.

6. The temperature-compensated crystal oscillator according to claim 5, wherein the temperature compensation circuit changes only the insensitive linear function when the temperature zone is shifted.

7. A temperature-compensated crystal oscillator comprising:
    an oscillation circuit including an oscillator;
    a temperature detector;
    a voltage variable capacitance element coupled to an oscillation loop of the oscillation circuit; and
    a temperature compensation circuit configured to apply a compensation voltage to the voltage variable capacitance element to compensate a temperature change in response to temperature data detected by the temperature detector;

wherein the temperature compensation circuit includes:

a memory storing a plurality correction point data, the respective correction point data being set in advance for each divided temperature zone, and for outputting, as digital data, a first point data in a lower temperature zone compared with temperature data detected by the temperature detector, a second point data in a higher temperature zone compared with the temperature data, a third point data in a further lower temperature zone than the first correction point data in the lower temperature zone, and a fourth correction point data in a further higher temperature zone than the second correction point data in the higher temperature zone;

a first converter for converting the first correction point data into analog data;

a second converter for converting the second correction point data into analog data;

a subtractor for obtaining a first slope by performing a subtraction between the second correction point data in the higher temperature zone and the third correction point data in the lower temperature zone, and a second slope by performing a subtraction between the first correction point data in the lower temperature zone and the fourth correction point data in the higher temperature zone;

a first multiplier for multiplying the first slope data by a first residue between the temperature detected by the temperature detector and a temperature corresponding to the first correction point data in the lower temperature zone;

a second multiplier for multiplying the second slope data by a second residue between the temperature detected by the temperature detector and a temperature corresponding to the second correction point data in the higher temperature zone;

a first adder for generating a first correction value by adding output data from the first converter and output data from the first multiplier;

a second adder for generating a second correction value by adding output data from the second converter and output data from the second multiplier; and a weighted average circuit for generating the compensation voltage by calculating a weighted average of the first correction value and the second correction value in accordance with the first residue and the second residue.

8. A temperature compensation method for an oscillator including a voltage variable capacitance element coupled to an oscillation loop of an oscillation circuit and for compensating temperature variations of an applied voltage to the voltage variable capacitance element, comprising the steps of:

setting a plurality of correction points data, the respective correction point data being set in advance for each divided temperature zone;

obtaining a first-order coefficient of a first correction point data in a lower temperature zone by performing a subtraction between a second correction point data in a higher temperature zone and a third correction point data in a further lower temperature zone than the first correction point data in the lower temperature zone;

obtaining a first-order coefficient of the second correction point data in the higher temperature zone by performing a subtraction between the first correction point data in the lower temperature zone and a fourth correction point data in a further higher temperature zone than the second correction point data in the higher temperature zone;

selecting a first correction point data in a lower temperature zone and a second correction point data in a higher temperature zone, as compared with detected temperature data;

performing an interpolation between the first and second correction point data by a weighted average first-order interpolation; and generating a compensation voltage.

* * * * *